US006053689A

United States Patent [19]

Li

[11] Patent Number: 6,053,689

[45] Date of Patent: Apr. 25, 2000

[54] GUIDE MECHANISM FOR ALIGNING A HANDHELD VACUUM PICKUP WAND WITH A SELECTED WAFER IN A CASSETTE

[75] Inventor: Meng Chun Li, Taipei, Taiwan

[73] Assignee: Taiwan Semiconductor Manufacturing Company Ltd., Hsin Chu, Taiwan

[21] Appl. No.: 09/323,364

[22] Filed: Jun. 1, 1999

[51] Int. Cl.[7] .......... B66C 1/02

[52] U.S. Cl. .......... 414/416; 414/937; 414/938; 414/941; 294/64.1

[58] Field of Search .......... 414/416, 937, 414/938, 941; 294/64.1; 29/743, 758; 269/3, 21

[56] References Cited

U.S. PATENT DOCUMENTS

| | | | |
|---|---|---|---|
| 4,496,180 | 1/1985 | Hillman et al. | 294/64.1 |
| 4,892,343 | 1/1990 | Hall | 294/64.1 |
| 5,169,192 | 12/1992 | Allison et al. | 294/64.1 |
| 5,217,273 | 6/1993 | Hendricsen et al. | 294/64.1 |
| 5,374,090 | 12/1994 | Goff | 294/64.1 |
| 5,799,994 | 9/1998 | Tsai et al. | 294/64.1 |
| 5,928,537 | 7/1999 | Fortune | 294/64.1 X |

*Primary Examiner*—Robert P. Olszewski
*Assistant Examiner*—Gerald J. O'Connor
*Attorney, Agent, or Firm*—Tung & Associates

[57] ABSTRACT

A guided vacuum pick-up device for picking up wafers in a wafer storage cassette and a method for using such device. In the device, a vacuum pick-up head is equipped with a guide member which intimately engages a guide bar molded on a wafer storage cassette such that the movement of the vacuum pick-up head can be precisely indexed to the spacing between the adjacent wafers by engaging a guide pin on the guide member to one of a number of positioning grooves provided circumferentially on the guide bar. The device can be used for picking up or putting back wafers in a wafer storage cassette without the danger of scratching or breaking the wafers by accidentally colliding with the wafers.

20 Claims, 2 Drawing Sheets

32 42 30 34 38 46 44 48 50 56 58 80 52 40

GUIDE MECHANISM FOR ALIGNING A HANDHELD VACUUM PICKUP WAND WITH A SELECTED WAFER IN A CASSETTE

FIELD OF THE INVENTION

The present invention generally relates to a semiconductor processing equipment and more particularly, relates to a guided vacuum pick-up wand for wafers that is equipped with a guide member for engaging a guide bar on a wafer storage cassette such that the danger of scratching wafers during the pick-up process is eliminated.

BACKGROUND OF THE INVENTION

In the fabrication of semiconductor devices, wafers of semiconducting nature, such as silicon wafers, must be processed through a multiplicity of fabrication steps which can amount to several hundred steps for a complicated IC device. For instance, a wafer is normally processed through a variety of fabrication steps which may include oxidation, dielectric layer deposition, stress relief and annealing, ion implantation, planarization, chemical-mechanical-polishing, etc. In each of these processing steps, the wafers are processed either singularly or in batches by loading them into a process machine or a wafer boat that can hold up to 24 wafers and then processing them in a horizontal or in a vertical processing chamber. The wafers can also be processed singularly in fabrication chambers that only process one wafer at a time. In-between the processes, the wafers are stored in a wafer storage cassette. One of such popularly used cassettes can hold up to 24 wafers vertically positioned in the cassette. The wafer must be picked-up by a suitable tool for loading or unloading into or from a wafer storage cassette to either a wafer boat or a process chamber for processing single wafer.

Wafer pick-up tools of various configurations have been designed and utilized for handling wafers in a semiconductor fabrication facility. Since wafers are processed in a clean room environment and cannot tolerate the presence of any contaminants, a wafer pick-up tool must be designed to satisfy this important requirement. It is expected that most mechanical pick-up devices, e.g., a clamping device, would generate contaminants due to its mechanical contact with a wafer surface. Consequently, a pick-up device that utilizes vacuum for contacting and holding the wafer is more desirable. Most commercially available vacuum pick-up devices consist of a handle and a fixed-position pick-up head. One of such device 10 is shown in FIG. 1.

As shown in FIG. 1, the vacuum pick-up head 12 of the pick-up device 10 is used to attach itself by vacuum to the backside of a wafer in order to pick-up the wafer. When the tool is used in a wafer storage device 20, as shown in FIG. 2, mechanical damages such as scratches or breakages can occur to the wafers 22 stored in the wafer cassette 24. In a wafer storage device 20 shown in FIG. 2, the wafers 22 are stacked together in close proximity to each other. For instance, in a typical wafer storage cassette 24 used for storing six inch wafers, the wafer-to-wafer distance is approximately 5 mm. The vacuum pick-up head 12 for the wafer pick-up device 10, even though is designed in a very small thickness, can seriously scratch the wafer when it is inserted in-between the wafers 22 in the wafer cassette 24 in an attempt to pick-up a wafer 22 on its backside. In extreme cases, when the vacuum pick-up head 12 directly collides with an edge of a wafer 22, a breakage of the wafer may occur.

It is therefore an object of the present invention to provide a vacuum pick-up device for semiconductor substrates that does not have the drawbacks or shortcomings of the conventional vacuum pick-up devices.

It is another object of the present invention to provide a vacuum pick-up device for semiconductor wafers that is equipped with a guide member on the device for guiding it on a wafer storage cassette.

It is a further object of the present invention to provide a guided vacuum pick-up device for semiconductor wafers that is equipped with a guide member for slidingly engaging a guide bar on a wafer storage cassette.

It is another further object of the present invention to provide a guided vacuum pick-up wand for semiconductor wafers that is equipped with a guide member which has a window therein to expose a pre-marked number on a guide bar integral with a wafer storage cassette.

It is still another object of the present invention to provide a guided vacuum pick-up wand for semiconductor wafers which is equipped with a guide member for slidingly engaging in Z-direction a guide bar located on a wafer storage cassette.

It is yet another object of the present invention to provide a guided vacuum pick-up wand for semiconductor wafers that is equipped with a guide member which slidingly engaging longitudinally a guide bar on a wafer storage cassette and circumferentially one of a plurality of positioning grooves on the guide bar.

It is still another further object of the present invention to provide a guided vacuum pick-up wand for picking up wafers from a wafer storage cassette that utilizes a vacuum pick-up head that has a thickness smaller than a spacing between two immediately adjacent wafers stored in the wafer storage cassette.

It is yet another further object of the present invention to provide a guided vacuum pick-up wand for picking up wafers from a wafer storage cassette that is equipped with a body portion formed with a guide member for slidingly engaging in a circumferential direction for the wand to move in-and-out of the spacing between two immediately adjacent wafers by engaging a guide pin on the guide member to one of a plurality of positioning grooves provided circumferentially on the guide bar.

SUMMARY OF THE INVENTION

In accordance with the present invention, a guided vacuum pick-up device for semiconductor substrates and a method for using such device are disclosed.

In a preferred embodiment, a guided vacuum pick-up device for picking up semiconductor substrates from a wafer storage cassette is provided which includes a vacuum pick-up head contiguous with an elongated wand, a vacuum passageway in the elongated wand in fluid communication with the vacuum pick-up head for supplying vacuum thereto, and a guide member mounted to the elongated wand for slidingly engaging in Z-direction (longitudinal direction) a guide bar on a cassette, the guide member may further include a guide pin for engaging in X-Y direction (or circumferential direction) one of a plurality of positioning grooves that is provided circumferentially on the guide bar.

In the guided vacuum pick-up device for semiconductor substrates, the vacuum pick-up head may further include elongated vacuum slots in a flat surface for contacting the semiconductor substrates. The vacuum passageway in the elongated wand is further in fluid communication with an air evacuation device, which may be a pump. The guide member may be provided with a circular inner surface for slidingly engaging a circular outer surface of the guide bar. The guide member may further be provided with a window for showing a pre-marked number on the guide bar.

In the guided vacuum pick-up device for semiconductor wafers, the plurality of positioning grooves provided circumferentially on the guide bar substantially equals the number of semiconductor substrates that can be held in the cassette. The pick-up device may be adapted for picking up wafers from a wafer storage cassette. The guide member and the vacuum pick-up head rotates on the guide bar by rotationally engaging a guide pin to one of the plurality of positioning grooves provided circumferentially on the guide bar. The plurality of positioning grooves are situated on the guide bar such that when the vacuum pick-up head mounted on the guide member is rotated into a pick-up position for a semiconductor substrate by engaging the guide pin to one of the positioning grooves, the vacuum pick-up head does not collide with any semiconductor substrates. The guide member may be mounted to the elongated wand through a rib section. The vacuum pick-up head has a thickness smaller than a spacing between two adjacent wafers stored in a wafer cassette. The vacuum pick-up head has a thickness smaller than 5 mm.

In another preferred embodiment, a guided vacuum pick-up wand for picking up wafers from a wafer storage cassette can be provided which includes a vacuum pick-up head that has a thickness smaller than a spacing between two immediately adjacent wafers stored in the wafer storage cassette, and a body portion that is formed contiguously with the vacuum pick-up head for supplying a vacuum to the head, the body portion is formed with a guide member for slidingly engaging in a longitudinal direction a guide bar on the wafer storage cassette and in a circumferential direction for the head to move in-and-out of the spacing between the two immediately adjacent wafers by engaging a guide pin on the guide member to one of a plurality of positioning grooves provided circumferentially on the guide bar.

In the guided vacuum pick-up wand for picking up wafers from a wafer storage cassette, the plurality of positioning grooves may be substantially equal to the total number of wafers stored in the wafer storage cassette. Each two adjacent positioning grooves in the plurality of positioning grooves may be spaced apart by a distance substantially equal to a sum of a distance between two adjacent wafers stored in the wafer storage cassette and a thickness of the wafer. The vacuum pick-up head may further include a plurality of elongated vacuum slots in a flat surface for contacting a backside of the wafers stored in the wafer storage cassette. The guide member may be connected to the body portion of the guided vacuum pick-up wand by a rib portion. The guide member may further be provided with a window for exposing a pre-marked number on the guide bar. The vacuum pick-up head has a thickness smaller than a spacing between two adjacent wafers stored in the wafer storage cassette.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a guided vacuum pick-up device for picking up semiconductor wafers from a wafer storage cassette and a method for using such device.

In the guided vacuum pick-up device (or the pick-up wand), a guide member is mounted as part of the vacuum pick-up device which slidingly engages in a longitudinal direction a guide bar equipped on the wafer storage cassette, the guide member is further equipped with a guide pin for engaging in a circumferential direction one of a number of positioning grooves provided circumferentially on the guide bar. By the longitudinal direction, it is meant a direction along the Z or the length direction of the guide bar. By the circumferential direction, it is meant a X-Y direction that is in a plane perpendicular to the length of the guide bar.

In a preferred embodiment, the guide member on the vacuum pick-up device is provided with a circular inner surface for slidingly engaging a circular outer surface of a guide bar in both the longitudinal and the circumferential directions. The guide member is further provided with a window portion that is see-through for showing a pre-marked number on the guide bar when the guide member rides on the guide bar. The number of positioning grooves that are formed in a circumferential direction on the guide bar is substantially equal to the number of semiconductor wafers that can be stored in the wafer storage cassette. The guide member and the vacuum pick-up head rides on the guide bar by rotationally engaging a guide pin equipped on the guide member to one of a number of positioning grooves provided circumferentially on the guide bar. A number of positioning grooves are situated on the guide bar such that when the vacuum pick-up head mounted on the guide member is rotated into a pick-up position for a semiconductor wafer by engaging a guide pin to one of the positioning grooves, the vacuum pick-up head can be moved in-and-out of the spacing between the stored wafers without colliding with any of the wafers. In order to accomplish such task, the vacuum pick-up head has a thickness that is smaller than a spacing, i.e., approximately 5 mm, between two adjacent wafers stored in the wafer storage cassette.

Figure 1:
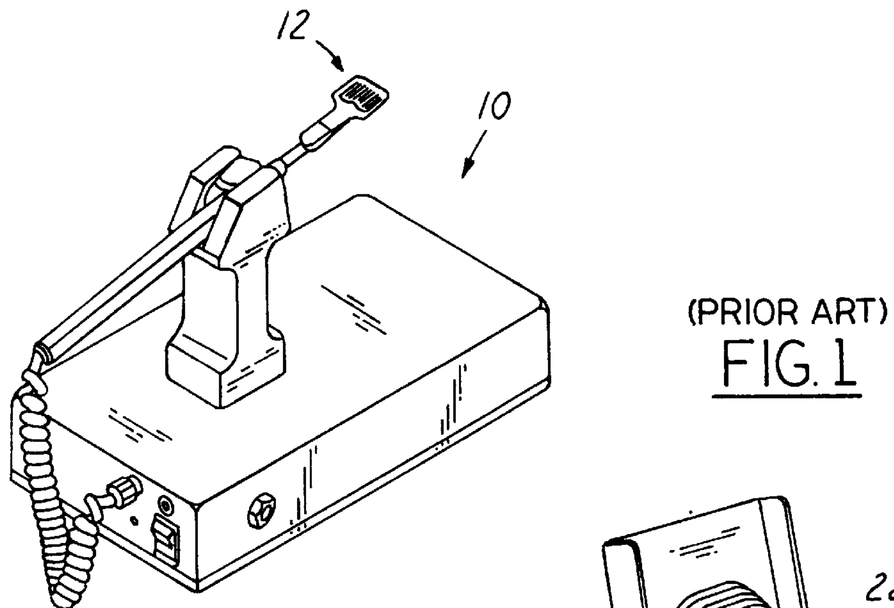
FIG. 1 is an illustration of a conventional vacuum pick-up device for semiconductor substrates.
Figure 2:
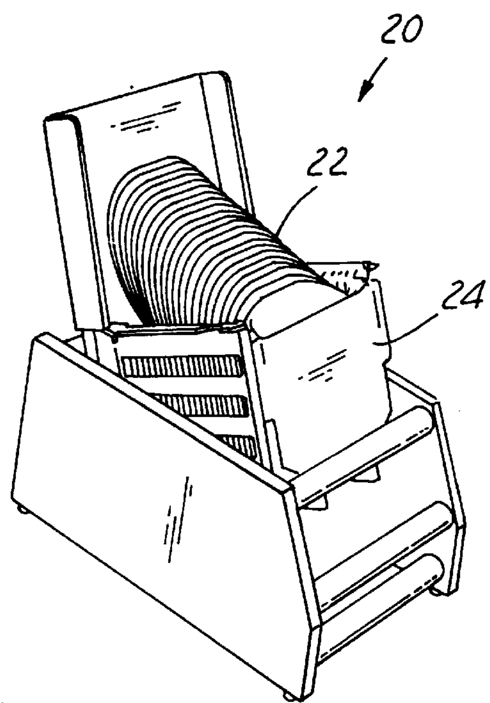
FIG. 2 is an illustration of a conventional wafer storage cassette.
Figure 3:
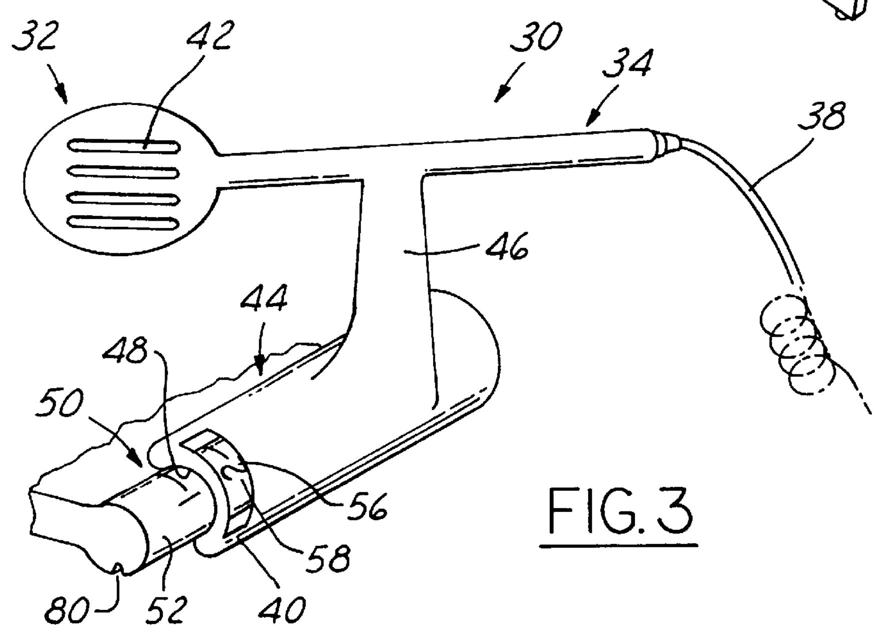
FIG. 3 is a perspective view of the present invention guided vacuum pick-up device resting on the guide bar of a wafer cassette.

Referring initially to FIG. 3, wherein a perspective view of the present invention guided vacuum pick-up device 30 is shown. The vacuum pick-up device 30 is constructed by a vacuum pick-up head 32 that is formed contiguously with an elongated wand 34 which has a vacuum passageway (not shown) therethrough for supplying the pick-up head 32 with a vacuum by a vacuum supply hose 38. The vacuum pick-up head 32 is normally constructed with a small thickness of less than 5 mm, or less than the spacing between two immediately adjacent wafers stored in a wafer storage cassette. The vacuum pick-up head 32 is supplied with a number of elongated slots 42 in a contact surface with the backside of a wafer.

The elongated wand 34 is further connected to a guide member 44 by a rib section 46. The guide member 44 is constructed in such a way that it intimately engages a circumferential surface 52 of a guide bar 50. In order to allow the guide member 44 to intimately engage and slide in both a longitudinal and a circumferential direction on the guide bar 50, a circular inner surface 48 on the inside of the guide member 44 and a circular exterior surface 52 on the guide bar 50 must be provided. The guide member 44 is further equipped with a see-through window 56 which allows a pre-marked number 58 to be identified through the guide member 44 when it rides on the guide bar 50.

Figure 4:
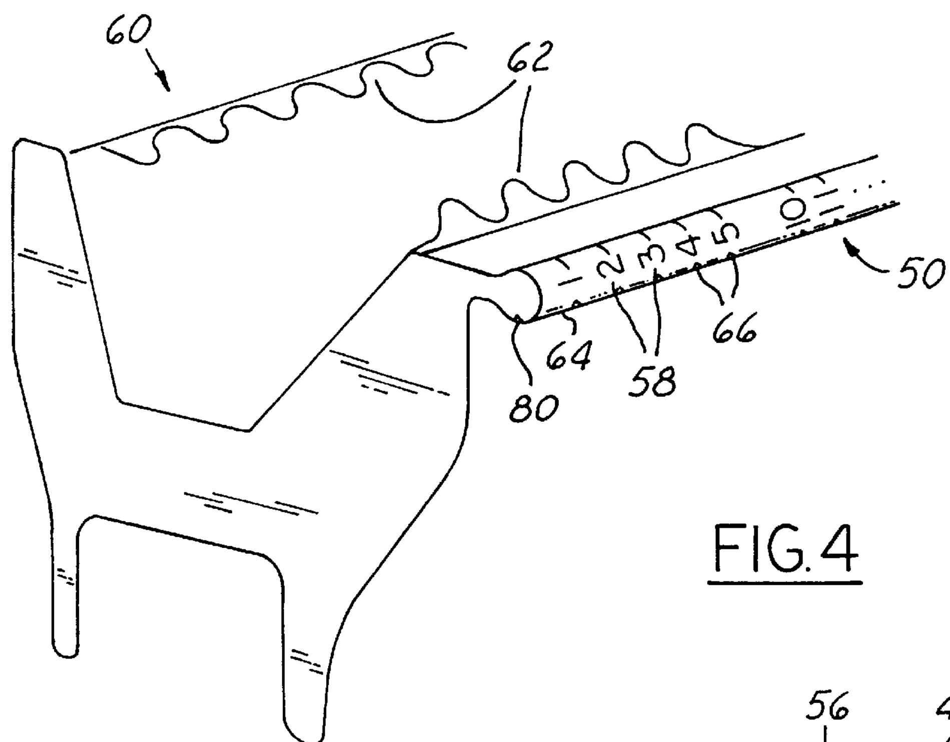
FIG. 4 is a perspective view of the wafer storage cassette equipped with a guide bar on one edge.
Figure 6:
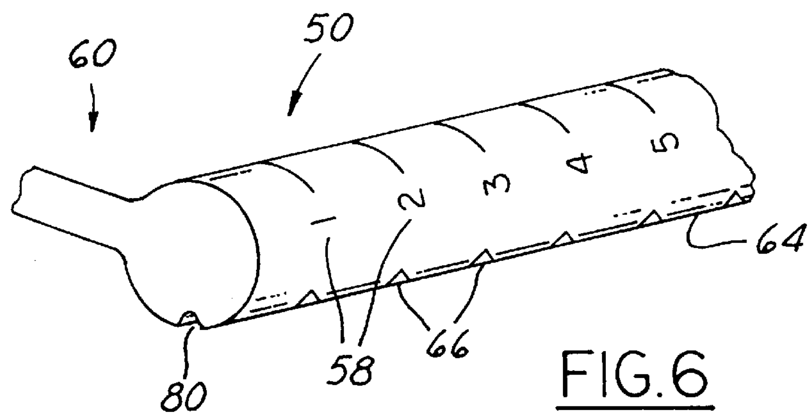
FIG. 6 is an enlarged, perspective view of the guide bar on the present invention wafer storage cassette.

A simplified perspective view of a wafer storage cassette 60 equipped with the present invention guide bar 50 on one side is shown in FIG. 4. Since most wafer storage cassettes are fabricated in plastic materials, for instance, by a plastic injection molding process, the guide bar 50 of the present invention can be easily molded-in by making small modification of the injection mold. A multiplicity of serrations 62 are provided on the cavity wall of the wafer storage cassette 60 for the insertion and placement of wafers. On the molded-in guide bar 50, a multiplicity of numerals 58 can be pre-marked by either the molding process carried out or by a printing process on the circumferential surface of the guide bar 50. On the lower surface 64 of the guide bar 50, a plurality of positioning grooves 66 are further provided in the circumferential direction. This is also shown in an enlarged view in FIG. 6. It should be noted that the number of positioning grooves 66 should be the total number of wafers that can be stored in a wafer storage cassette less one, since each positioning groove 66 represents a spacing between two immediately adjacent wafers positioned in the wafer storage cassette 60 and in the serrations 62.

Figure 5:
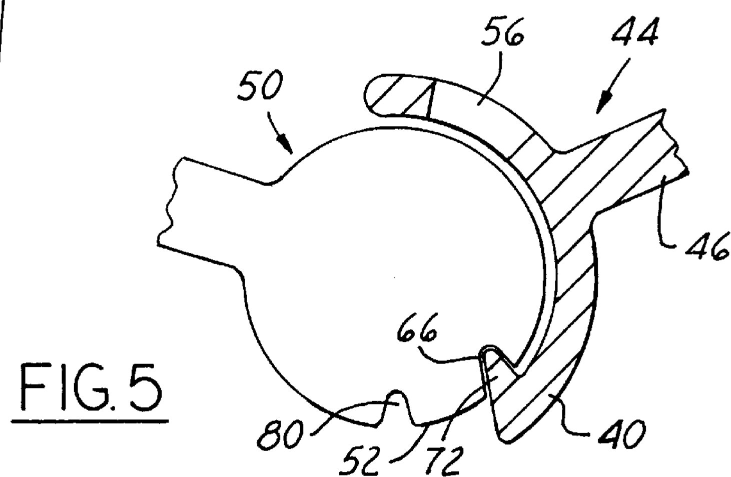
FIG. 5 is an enlarged, cross-sectional view of the present invention guided vacuum pick-up device resting on a guide bar with the guide pin engaging a positioning groove.

In order to engage the guide member 44 to the plurality of positioning grooves 66, a guide pin 72 is further provided on the inner surface 48 of the guide member 44. The location of the guide pin 72 is preferably at the front end 40 of the guide member 44. As shown in FIG. 5, the guide pin 72 intimately engages one of the positioning grooves 66 such that the guide member 44, or the vacuum pick-up head 32 can be slided in an X-Y direction, or in a circumferential direction of the guide bar 50 into a spacing between the immediately adjacent wafers. By accurately locating the plurality of positioning grooves 66 in relation to the serrations 62 and the stored wafers, the pick-up head 32 can precisely swing-in or swing-out in-between the stored wafers without touching any of the wafers, and thus avoiding any possibility of scratching or otherwise damaging the wafers.

To further facilitate the movement of the guide member 44 along the longitudinal, or the Z-axis of the guide bar 50, a separate groove running in the longitudinal direction on the bottom surface 52 of the guide bar 50 be provided. The longitudinal groove 80 permits the guide member 44 to slide on the guide bar 50 to any desirable position, identified by the numeral 58 shown through window 56, and then stopped for the guide pin 72 to engage a positioning groove for retrieving a wafer from the wafer storage cassette 60.

The present invention novel guided vacuum pick-up device for semiconductor substrates and a method for using such device have therefore been amply described in the above descriptions and in the appended drawings of FIGS. 3–6.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows:

What is claimed is:

1. A guided vacuum pick-up device for semiconductor substrates comprising:

a vacuum pick-up head contiguous with an elongated wand, a vacuum passageway in said elongated wand in fluid communication with said vacuum pick-up head for supplying vacuum thereto, and a guide member mounted on said elongated wand for slidingly engaging a guide bar on a cassette, said guide member further comprising a guide pin for engaging one of a plurality of positioning grooves provided circumferentially on said guide bar.

2. A guided vacuum pick-up device for semiconductor substrates according to claim 1, wherein said vacuum pick-up head further comprising elongated vacuum slots in a flat surface for contacting said semiconductor substrates.

3. A guided vacuum pick-up device for semiconductor substrates according to claim 1, wherein said vacuum passageway in said elongated wand is in fluid communication with an air evacuation device.

4. A guided vacuum pick-up device for semiconductor substrates according to claim 3, wherein said air evacuation device is a pump.

5. A guided vacuum pick-up device for semiconductor substrates according to claim 1, wherein said guide member being provided with a circular inner surface for slidingly engaging a circular outer surface of said guide bar.

6. A guided vacuum pick-up device for semiconductor substrates according to claim 1, wherein said guide member being provided with a window for showing a pre-marked number on said guide bar.

7. A guided vacuum pick-up device for semiconductor substrates according to claim 1, wherein said plurality of positioning grooves provided circumferentially on said guide bar substantially equals the number of semiconductor substrates that can be held in said cassette.

8. A guided vacuum pick-up device for semiconductor substrates according to claim 1, wherein said pick-up wand is adapted for picking up wafers from a wafer cassette.

9. A guided vacuum pick-up device for semiconductor substrates according to claim 1, wherein said guide member and said vacuum pick-up head rotates on said guide bar by rotationally engaging said guide pin to one of said plurality of positioning grooves provided circumferentially on said guide bar.

10. A guided vacuum pick-up device for semiconductor substrates according to claim 1, wherein said plurality of positioning grooves are situated on said guide bar such that when said vacuum pick-up head mounted on said guide member is rotated into a pick-up position for a semiconductor substrate by engaging said guide pin to one of said positioning grooves, the vacuum pick-up head does not collide with any semiconductor substrate.

11. A guided vacuum pick-up device for semiconductor substrates according to claim 1, wherein said guide member is mounted to said elongated wand through a rib section.

12. A guided vacuum pick-up device for semiconductor substrates according to claim 1, wherein said vacuum pick-up head has a thickness smaller than a spacing between two adjacent wafers stored in a wafer cassette.

13. A guided vacuum pick-up device for semiconductor substrates according to claim 1, wherein said vacuum pick-up head has a thickness smaller than 5 mm.

14. A guided vacuum pick-up wand for picking up wafers from a wafer storage cassette comprising:

a vacuum pick-up head having a thickness smaller than a spacing between two immediately adjacent wafers stored in said wafer storage cassette, and a body portion formed contiguously with said vacuum pick-up head for supplying a vacuum to said head, said body portion being formed with a guide member for slidingly engaging in a longitudinal direction a guide bar on said wafer storage cassette and in a circumferential direction for said head to move in-and-out of said spacing between said two immediately adjacent wafers by engaging a guide pin on said guide member to one of a plurality of positioning grooves provided circumferentially on said guide bar.

15. A guided vacuum pick-up wand for picking up wafers from a wafer storage cassette according to claim 14, wherein said plurality of positioning grooves being substantially equal to the total number of wafers stored in said wafer storage cassette.

16. A guided vacuum pick-up wand for picking up wafers from a wafer storage cassette according to claim 14, wherein each two adjacent positioning grooves in said plurality of positioning grooves is spaced apart by a distance substantially equal to a sum of a distance between two adjacent wafers stored in said wafer storage cassette and a thickness of said wafers.

17. A guided vacuum pick-up wand for picking up wafers from a wafer storage cassette according to claim 14, wherein said vacuum pick-up head further comprising a plurality of elongated vacuum slots in a flat surface for contacting a backside of said wafers stored in said wafer storage cassette.

18. A guided vacuum pick-up wand for picking up wafers from a wafer storage cassette according to claim 14, wherein said guide member being connected to said body portion of the guided vacuum pick-up wand by a rib portion.

19. A guided vacuum pick-up wand for picking up wafers from a wafer storage cassette according to claim 14, wherein said guide member being provided with a window for observing a pre-marked number on said guide bar.

20. A guided vacuum pick-up wand for picking up wafers from a wafer storage cassette according to claim 14, wherein said vacuum pick-up head has a thickness smaller than a spacing between two immediately adjacent wafers stored in said wafer cassette.

* * * * *